(12) United States Patent
Isobe et al.

(10) Patent No.: US 7,915,793 B2
(45) Date of Patent: Mar. 29, 2011

(54) THIN FILM TUNING-FORK TYPE INFLECTION RESONATOR AND ELECTRIC SIGNAL PROCESSING ELEMENT

(75) Inventors: Atsushi Isobe, Kodaira (JP); Nobuhiko Shibagaki, Kokubunji (JP); Kengo Asai, Hachioji (JP); Hisanori Matsumoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 136 days.

(21) Appl. No.: 11/670,081

(22) Filed: Feb. 1, 2007

(65) Prior Publication Data

US 2007/0182291 A1    Aug. 9, 2007

(30) Foreign Application Priority Data

Feb. 6, 2006    (JP) ................. 2006-028230

(51) Int. Cl.
*H03H 9/21* (2006.01)
*H01L 41/08* (2006.01)

(52) U.S. Cl. ...................................... 310/370

(58) Field of Classification Search .............. 310/370
See application file for complete search history.

(56) References Cited

U.S. PATENT DOCUMENTS

| 4,930,351 | A * | 6/1990 | Macy et al. ............. 73/504.04 |
| 7,051,592 | B2 * | 5/2006 | Fujimoto et al. ......... 73/504.16 |
| 7,164,179 | B2 * | 1/2007 | Nakanishi et al. ........... 257/414 |
| 2005/0029606 | A1 * | 2/2005 | Nakanishi et al. ........... 257/414 |
| 2006/0214749 | A1 * | 9/2006 | Yamada ....................... 333/200 |

FOREIGN PATENT DOCUMENTS

| JP | 54092091 A | * | 7/1979 |
| JP | 55038785 A | * | 3/1980 |
| JP | 55073121 A | * | 6/1980 |

* cited by examiner

*Primary Examiner* — J. SanMartin
(74) *Attorney, Agent, or Firm* — Brundidge & Stanger, P.C.

(57) ABSTRACT

A compact resonator has a wide bandwidth and a small variation of the specific vibration frequency. The resonator is a thin film tuning-fork type inflection resonator in which a thin film made of a piezoelectric material is formed on a substrate on which a lower electrode is formed, and an upper electrode is formed on the piezoelectric thin film.

8 Claims, 16 Drawing Sheets

THIN FILM TUNING-FORK TYPE INFLECTION RESONATOR AND ELECTRIC SIGNAL PROCESSING ELEMENT

CLAIM OF PRIORITY

The present application claims priority from Japanese application JP 2006-028230 filed on Feb. 6, 2006, the content of which is hereby incorporated by reference into this application.

FIELD OF THE INVENTION

The present invention relates to a thin film tuning-fork type resonator formed by a film manufacturing method and employed for generating reference frequency signals for a microcomputer. Furthermore, the present invention relates to an electric signal processing element that uses the thin film tuning-fork type resonator.

BACKGROUND OF THE INVENTION

A conventional quartz tuning-fork type resonator is manufactured by cutting a rock quartz, generated with an autoclave or the like, into a thin slice, forming the thin-slice quartz into a tuning-fork shape by a lithography process and quartz-specific anisotropic etching, arranging the electrodes on both sides of the thin quartz formed into the tuning-fork shape, and then mounting the thin quartz on the system.

Generally, resonators are required to be high in Q value and low in manufacturing cost. In the case of the quartz tuning-fork type inflection resonator, the specific vibration frequency must match a desired frequency (usually 32.7 kHz). The specific vibration frequency varies according to the variation of the anisotropic etching of the quartz and the variation of the electrode forming time process. A desired vibration frequency is thus obtained through frequency trimming by etching part of the resonator with a laser beam. This trimming process cost is high, which is why resonators are required to have electric characteristics that are insensitive to the manufacturing variations.

Electrical trimming that uses an external electric circuit is usually employed for such a frequency trimming method. The method is effective to suppress the process cost, and thereby it is better than laser trimming. However, when such an external electric circuit is used, the frequency change width becomes proportional to the bandwidth of the subject resonator. In the case of the quartz tuning-fork type resonator, the bandwidth is about 0.2%, which is smaller than the process variations. Therefore, the electrical trimming is insufficient to eliminate the process vibrations completely. Thus, a laser is always needed for frequency trimming.

As systems are reduced in size and LSI operation speeds are improved, size reduction and higher frequency employment are also required for resonators. When such size reduction and higher frequency employment are achieved, process variations come to affect the variations of the specific vibration frequency more.

It will thus be important for such resonators to meet the requirements of the system size reduction, higher specific vibration frequency, higher Q value, wider bandwidth, and small electric characteristic variation with respect to the process variations.

SUMMARY OF THE INVENTION

However, the above described conventional quartz tuning-fork type resonator includes the following problems.

Because the above manufacturing method is employed for rock quartzes, the conventional typical manufacturing method is limited to miniaturize rock quartzes. In addition, when a higher specific vibration frequency is used, the subject resonator must be reduced in size, and therefore it is difficult to manufacture the resonator by the above manufacturing process. Furthermore, the bandwidth of the resonator becomes narrow and the specific vibration frequency process variation becomes large.

Under such circumstances, it is an object to solve such conventional problems and provide a micro-size resonator with small specific vibration frequency variations with respect to processes. In another aspect of the present invention, it is also possible to provide a resonator having a wider bandwidth.

It is another object of the present invention to provide a simple-structured resonator that can obtain a high specific vibration frequency.

To achieve the main object of the present invention, the resonator includes a lower electrode, a piezoelectric thin film formed on the lower electrode, and an upper electrode formed on the piezoelectric thin film. The piezoelectric thin film functions as an inflection resonator patterned as a tuning fork.

To achieve the main object of the present invention, the electrodes of the resonator, simply structured as described above, are each positioned within a range of ⅔ of the distance from the root of the respective vibrating part to the tip thereof.

In the case of the tuning-fork type resonator, the resonator is structured symmetrically with respect to both top and bottom tuning fork directions to keep the Q value high. When such a tuning-fork type inflection resonator is manufactured according to thin film technology, however, some problems specific to the thin film process arise. That is, because the piezoelectric thin film is tapered at its sides in the etching process, the symmetry between those sides is lost. Further, because the quartz resonator is processed from a bulk material and ceramic resonators are formed in a sintering process, this tapering is very small when compared with that of thin film resonators. In addition, when a thin film resonator is formed on the lower electrode and an upper electrode is formed on the thin film resonator, the lower electrode is embedded in the resonator as deep as its thickness.

The problem of the lost symmetry between those two points (sides) is different from the problem of ceramic resonators; it is specific to thin film tuning-fork type resonators, which causes other problems including bandwidth reduction and Q value degradation.

To avoid such conventional problems, in the resonator of the present invention structured as described above, an intermediate potential is given to the lower electrode.

Furthermore, in order to achieve the above additional object of the present invention, a notch should preferably be formed at the side surface around each tip of the vibrating part, or a recess or projection (or a combination of a recess and a projection) should preferably be formed at the side surface.

Employment of ring-type or sensor-type resonators as piezoelectric thin film resonators is also reported. However, the electrical characteristic variations of those resonators with respect to the process variations are large. Especially, in the case of ring-type resonators, the bandwidth is narrow, so that the resonators always require process trimming. As a result, they come to be difficult to be integrated in LSI.

In addition, unlike quartz, a thin film is always tapered at its side surfaces when it is patterned. This causes degradation in both bandwidth and Q value, and the electrical characteristic is also degraded due to the taper angle variations. This is why integration of such ring resonators in LSI is difficult.

Hereinafter, some embodiments of the present invention will be described.

(1) A typical embodiment of the present invention is a thin film tuning-fork type inflection resonator comprising a piezoelectric film having a tuning fork shape and a plurality of vibrating parts; a first metallic electrode formed on a first surface of the piezoelectric film; and a second metallic electrode formed on a second surface of the piezoelectric film, the second surface being at the opposite side of the first surface of the piezoelectric film. The thin film tuning-fork type inflection resonator is fixed on a nonmetallic substrate at least at one point thereon. The piezoelectric film, the first metallic electrode, and the second metallic electrode are each thin films formed by a film manufacturing method. The first and second surfaces of the piezoelectric film are parallel to the surface of the nonmetallic substrate and the first metallic electrode is formed as a film on the piezoelectric film. The piezoelectric film is formed so as to cover the second metallic electrode.

(2) In another embodiment of the present invention, in the thin film tuning-fork type inflection resonator described in (1) above, the tuning-fork-shaped piezoelectric film includes at least a vibrating part, a supporting part, and a pedestal part. The first and second metallic electrodes are formed at least on part of the pedestal part and on part of the vibrating part, respectively, and the area where the first metallic electrode faces the second metallic electrode on the vibrating part are positioned closer to the root of the vibrating part by ⅔ of the distance from the root to the tip of the vibrating part.

(3) In still another embodiment of the present invention, in the thin film tuning-fork type inflection resonator described in (2) above, the first metallic electrode comprises a plurality of electrode films and the second metallic electrode comprises a single electrode film.

(4) In still another embodiment of the present invention, in the thin film tuning-fork type inflection resonator described in (2) or (3) above, at least one of the plurality of vibrating parts is formed such that the vibrating part has a recess at its side surface, the vibrating part has a projection at its side surface, or the vibrating part has a hole passing through a portion between the first surface and the second surface.

(5) In still another embodiment of the present invention, in the thin film tuning-fork type inflection resonator described in (4) above, all of the plurality of vibrating parts have at least two of the recess, projection, and hole.

Furthermore, the present invention can provide an electric signal processing element as described below using the resonator of the present invention.

(6) In still another embodiment of the present invention, an electric signal processing element includes at least the thin film tuning-fork type inflection resonator described in (1) and at least an electronic active element mounted on a semiconductor substrate, and the nonmetallic substrate on which the thin film tuning-fork type inflection resonator is fixed, as well as the semiconductor substrate are fixed on the same base.

(7) The electric signal processing element may enable a plurality of the thin film tuning-fork type inflection resonators to be fixed to the nonmetallic substrate.

(8) The electric signal processing element may enable the thin film tuning-fork type inflection resonator to be fixed to a semiconductor substrate on which at least one of the electronic active elements is formed as the above-described nonmetallic substrate.

According to one aspect of the present invention, therefore, it is possible to provide a resonator with a small range of frequency variations using a thin film piezoelectric material.

According to another aspect of the present invention, it is possible to provide a compact resonator using a thin film piezoelectric material to make it easier to integrate the resonator with electronically active elements.

According to still another aspect of the present invention, it is possible to provide an integrated circuit device with a small manufacturing deviation, in which a compact resonator that uses a thin piezoelectric material is integrated with electronically active elements.

DETAILED DESCRIPTION OF THE PREFERRED EMBODIMENTS

Figure 1:
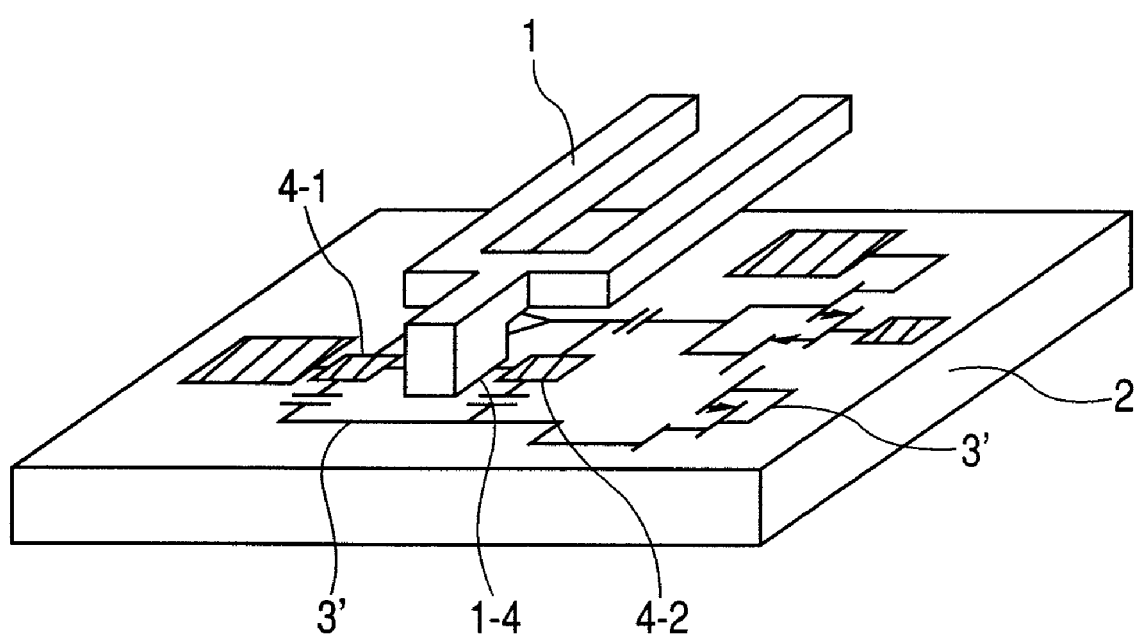
FIG. 1 shows a perspective view of a first embodiment of the present invention.

Hereinafter, the thin film tuning-fork type resonator of the present invention will be described in detail with reference to preferred embodiments shown in the drawings.

Figure 2:
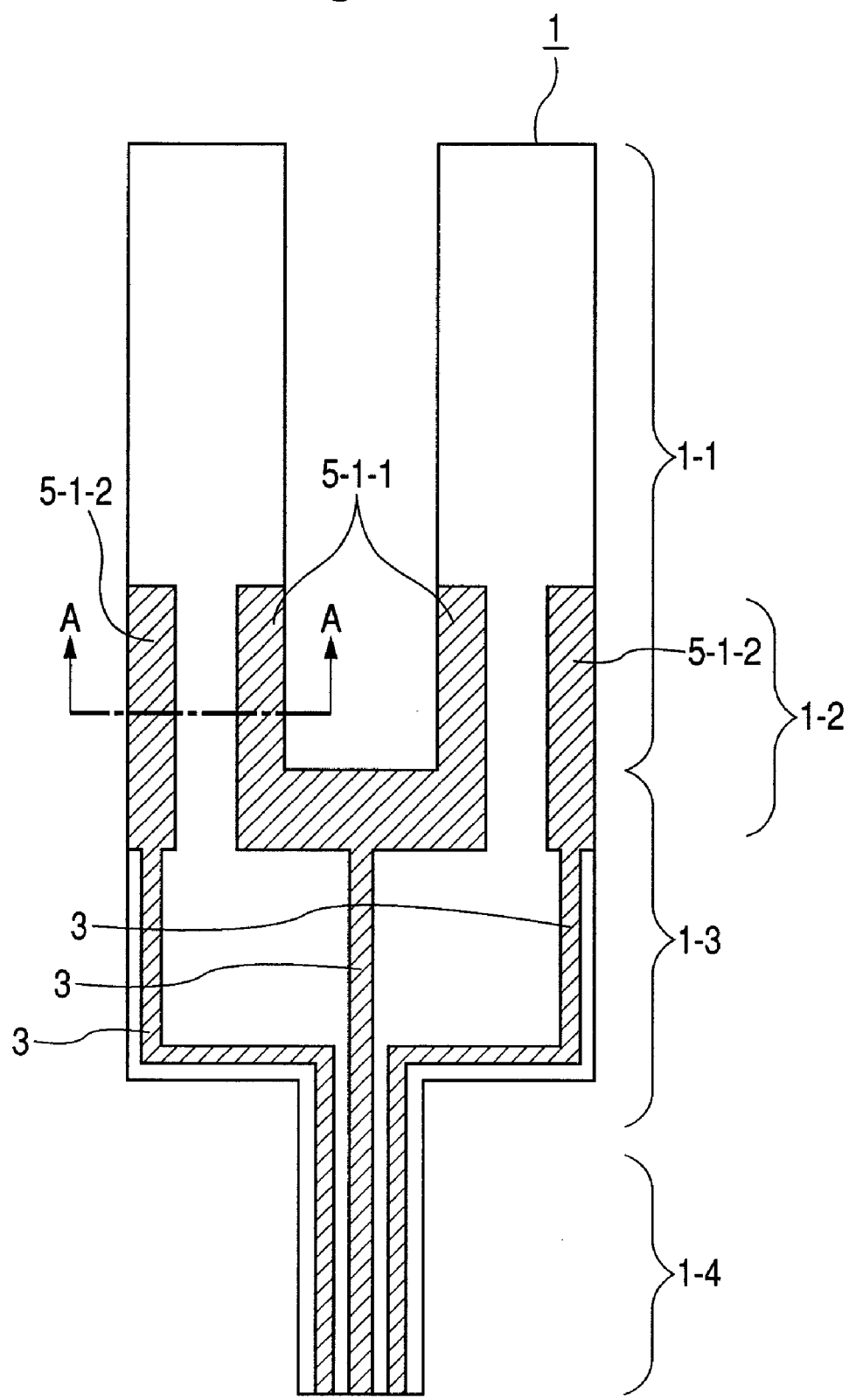
FIG. 2 shows a top view of a resonator in the first embodiment of the present invention.
Figure 3:
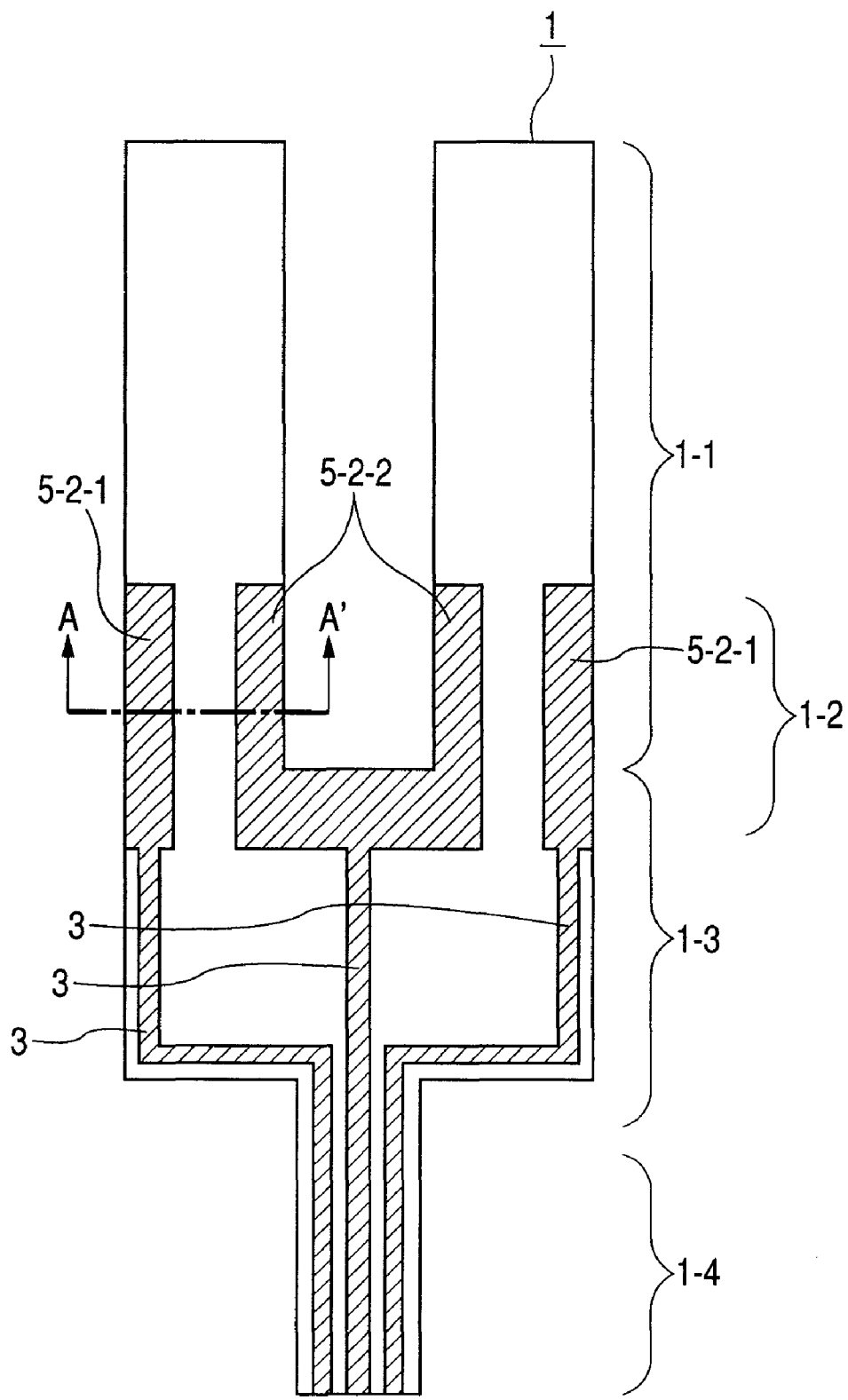
FIG. 3 is a bottom view of the resonator in the first embodiment of the present invention.
Figure 4A:
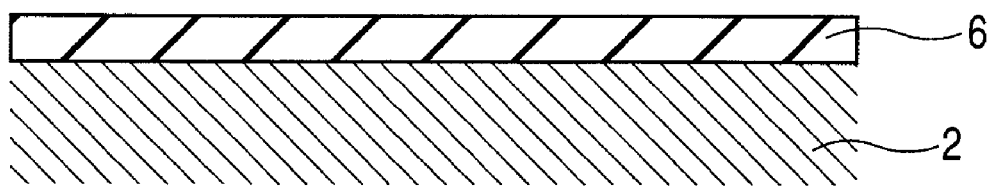
FIG. 4A is a cross-sectional view of the resonator showing, in sequential order, the manufacturing processes in the first embodiment of the present invention.
Figure 4B:
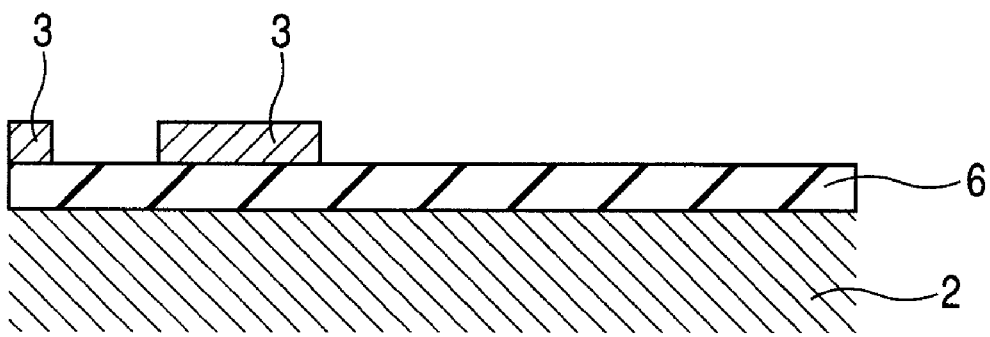
FIG. 4B is another cross-sectional view of the resonator showing, in sequential order, the manufacturing processes in the first embodiment of the present invention.
Figure 4C:
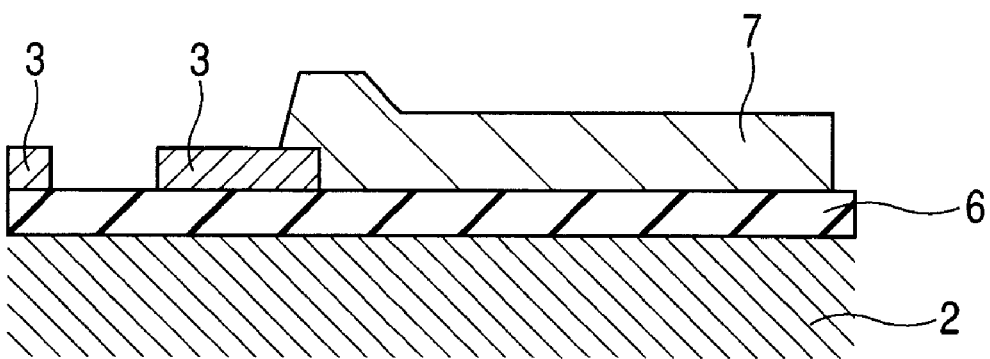
FIG. 4C is still another cross-sectional view of the resonator showing, in sequential order, the manufacturing processes in the first embodiment of the present invention.
Figure 4D:
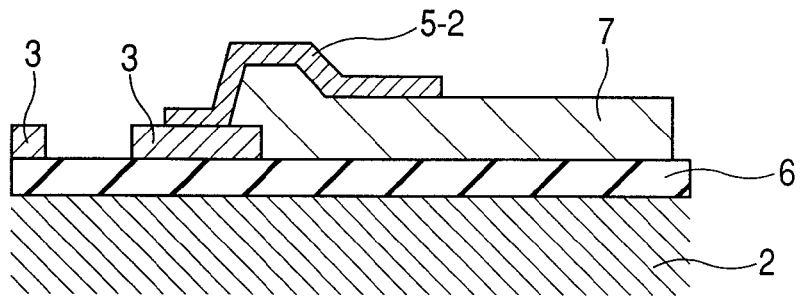
FIG. 4D is still another cross-sectional view of the resonator showing, in sequential order, the manufacturing processes in the first embodiment of the present invention.
Figure 4E:
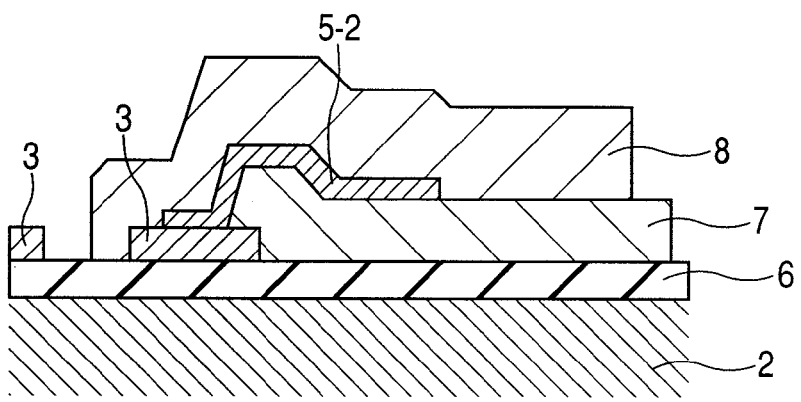
FIG. 4E is still another cross-sectional view of the resonator showing, in sequential order, the manufacturing processes in the first embodiment of the present invention.
Figure 4F:
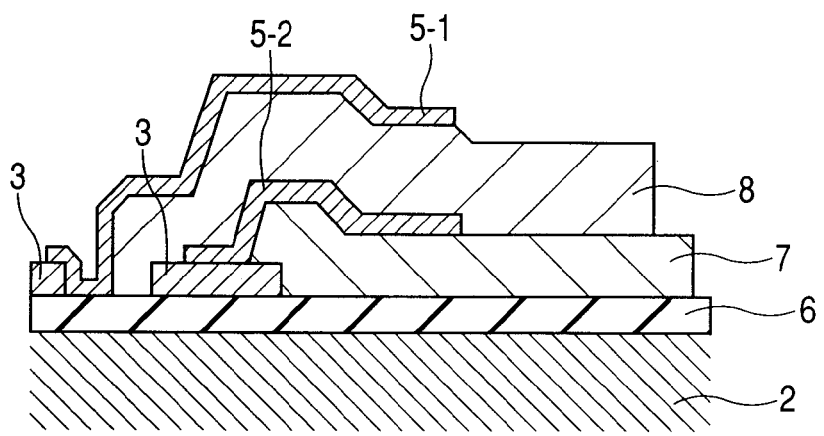
FIG. 4F is still another cross-sectional view of the resonator showing, in sequential order, the manufacturing processes in the first embodiment of the present invention.
Figure 4G:
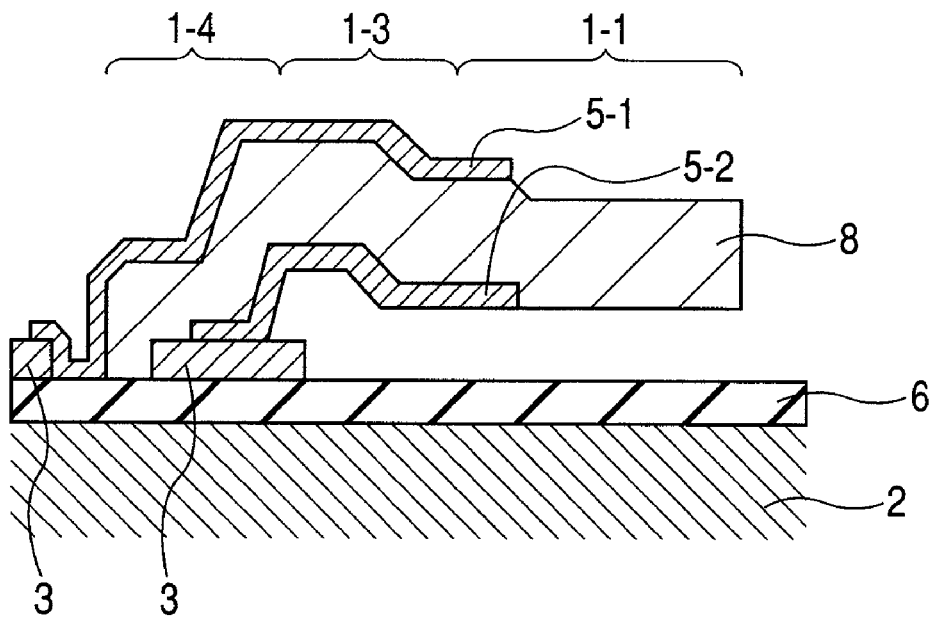
FIG. 4G is still another cross-sectional view of the resonator showing, in sequential order, the manufacturing processes in the first embodiment of the present invention.
Figure 4H:
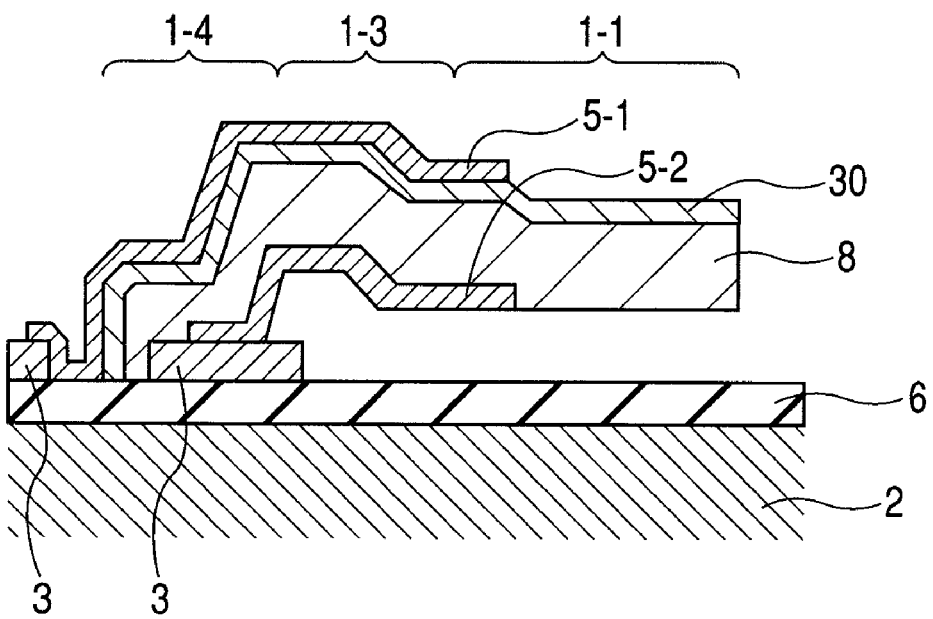
FIG. 4H is a cross-sectional view of a resonator in another embodiment of the present invention.

FIG. 1 is a perspective view of a thin film tuning-fork type resonator according to a first embodiment of the present invention. FIGS. 2 and 3 are top and bottom drawings of the resonator, respectively. A resonator 1 is provided in parallel to a surface of a silicon substrate 2. The resonator 1 has a tuning fork shape. More concretely, as shown clearly in FIGS. 2 and 3, the resonator 1 comprises a pair of vibrating parts 1-1 (width; 30 um, length; 50 um respectively); a pair of excitation parts 1-2 for exciting the vibrating parts; a pedestal part 1-3 for separating vibration energy accumulated in both vibrating parts 1-1 and excitation parts 1-2 from a supporting part 1-4; and a supporting part 1-4 for fixing the resonator 1 to the silicon substrate 2 physically. The exciting parts 1-2 are formed doubly in both of the vibrating parts 1-1 and part of the pedestal part 1-3 so as to function as an exciting part.

Furthermore, an electric lead line 3 is formed in the supporting part 1-4 to connect the electrodes of the resonator 1 electrically to ports 4-1 and 4-2 provided on the silicon substrate (see FIG. 1). In FIG. 1, an oscillator (see FIG. 17 to be shown later) is formed on the silicon substrate using a CMOS inverter. In some cases, in the oscillator, other electrical parts such as transistors, inductors, capacitors, resistors, switches such as FETs, and various terminals may be connected electrically to each another through the electric lead line 3.

On the surface opposite to the surface facing the silicon substrate are formed metallic thin film electrodes 5-1-1 and 5-1-2, having two different types of electric potentials, by a thin film forming process. On the back side (a surface facing the silicon substrate) of the exciting part 1-2 are formed metallic thin film electrodes 5-2-1 and 5-2-2, having two different types of electric potentials, by a thin film forming process. The lower electrodes 5-2-1 and 5-2-2 of the exciting part 1-2 are almost the same as the upper electrodes in shape. However, the lower electrodes 5-2-1 and 5-2-2 are connected to a port that is different from that to which the upper electrodes are connected. When an AC voltage is applied between the first port 4-1 and the second port 4-2, the directions of the electric field potentials running in the resonator 1 come to differ inside (between) the vibrating parts than outside the vibrating parts at the exciting part 1-2; they flow in directions counter to each other.

So far, some examples have been reported of tuning-fork type inflection resonators composed with a quartz or sintered ceramic material. Nevertheless, it is still difficult to form a quartz or sintered ceramic material on a silicon substrate in a low-cost film manufacturing process. To manufacture a resonator on a silicon substrate conventionally, therefore, the quartz or ceramic resonator manufactured separately must be bonded on a silicon substrate. In addition, to form electrodes on both sides of the resonator, expensive two-sided patterning is required. This is why a new low-cost manufacturing method has been demanded for manufacturing resonators.

In the first embodiment of the present invention, a thin film made of a piezoelectric material is employed. The thin film, which is typically an aluminum nitride or zinc oxide film, is oriented to the c-axis. FIGS. 4A through 4G show how the resonator is manufactured. At first, a silicon substrate 2 having an insulation film 6 is prepared. The insulation film 6 should preferably be formed as a silicon dioxide film when the substrate is made of silicon. In this case, on the silicon substrate 2 are formed (in advance) transistors, inductors, capacitors, resistors, switches such as FETs, and various terminals according to the final use purpose of the subject device (see FIG. 4A). At first, a necessary electric lead line 3 is formed (see FIG. 4B). Then, a sacrificial layer 7 is formed. On this sacrificial layer 7 is formed a lower electrode 5-2 (see FIG. 4D) and a piezoelectric thin film 8 (see FIG. 4E). When a silicon substrate is employed, the sacrificial layer 7 should preferably be a PSG film. In addition, an upper electrode 5-1 is formed over this sacrificial layer 7 (see FIG. 4F). Finally, the sacrificial layer 7 is removed. As a result, a resonator 1 is formed on the silicon substrate 2. The sacrifice layer 7, the lower electrode 5-2, the piezoelectric thin film 8, and the upper electrode 5-1 are formed by a film forming method represented by the coating, sputtering, CVD, and evaporation methods.

In the typical embodiment of the present invention, a c-axis-oriented piezoelectric thin film is used as a main material for composing the resonator. Thus, two-sided patterning is not required. Accordingly, resonators can be formed on a silicon substrate in a low-cost film forming process. Furthermore, the c-axis-oriented piezoelectric thin film, that is typically an aluminum nitride or zinc oxide thin film, enables the subject resonator to obtain a wider bandwidth than quartz resonators, since the piezoelectric constant d31 of the resonator, which affects inflection, is larger than that of quartz resonators. The d31 denotes a piezoelectric constant for representing a variation (=elongation value) in first direction (the in-plane direction) when a voltage is applied in third direction (the thickness direction, parallel to the c-axis quartz). First Direction is perpendicular to third direction. Here, the d31 is shown as a typical example of a material constant for representing how much the inflection vibration can be excited using an electric field in the thickness direction.

In the case of the conventional resonator represented by quartz resonators, the frequency trimming is carried out with, typically, a laser beam. Consequently, the conventional method is not required to widen the bandwidth to make frequency matching to compensate the process variations. On the other hand, when manufacturing a resonator on a silicon substrate, a batching process is needed with use of a large-sized wafer. In this case, the laser trimming for each element is so expensive that it cannot be employed to avoid cost increasing. Instead, electrical frequency trimming is needed for frequency matching. Therefore, unlike quartz resonators, a resonator formed on a silicon substrate is always required to be wide in bandwidth. As shown in this example, the resonator can be formed favorably at a low cost by using a c-axis-oriented piezoelectric thin film that is typically an aluminum nitride or zinc oxide thin film.

Although omitted in FIG. 4, a piezoelectric film is formed on a surface of the resonator 1, whereby the resonator is improved in both long-term reliability and short-term reliability. Particularly, in a case where silicon oxide of which the ratio of elasticity has a reverse temperature characteristic is used as a piezoelectric film, the temperature stability of the vibration frequency, as well as the short-term reliability of the resonator, are improved significantly. FIG. 4H shows a cross-sectional view of the resonator in this embodiment. In FIG. 4H, the same reference numerals are used for the same parts as those in FIG. 4G. Reference numeral 30 denotes a piezoelectric film in this embodiment.

Figure 5A:
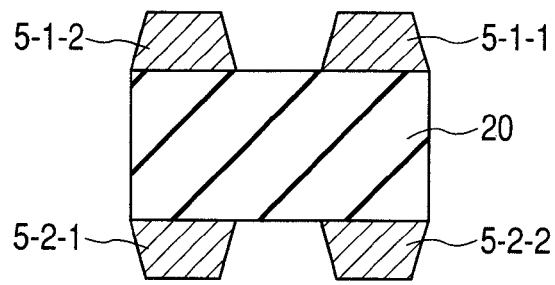
FIG. 5A is an explanatory cross-sectional view of a vibrating part of a typical conventional quartz resonator.
Figure 5B:
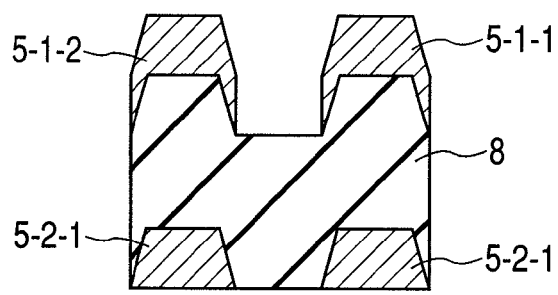
FIG. 5B is a cross-sectional view of a vibrating part of the resonator shown in FIG. 2, taken along a line A-A, in association with the present invention.

FIG. 5B shows a cross-sectional view of an excitation part in this embodiment. This cross-sectional view is taken along a line A-A in FIG. 2. On the other hand, FIG. 5A shows a cross-sectional view of an excitation part in a conventional embodiment, shown for comparison with this embodiment of the present invention. In the conventional embodiment, upper electrodes 5-1-1 and 5-1-2, as well as lower electrodes 5-2-1 and 5-2-2, are formed by a film forming method on both sides of a single rock quartz 20, respectively. Accordingly, the cross-sectional shape of the quartz 20 is ideally a rectangle. In the thin film resonator in this embodiment of the present invention, because a piezoelectric thin film 8 is formed on lower electrodes 5-2-1 and 5-2-2 on the substrate, the cross-sectional shape of the piezoelectric material varies. Then, upper electrodes 5-1-1 and 5-1-2 are formed over the piezoelectric material.

Figure 6:
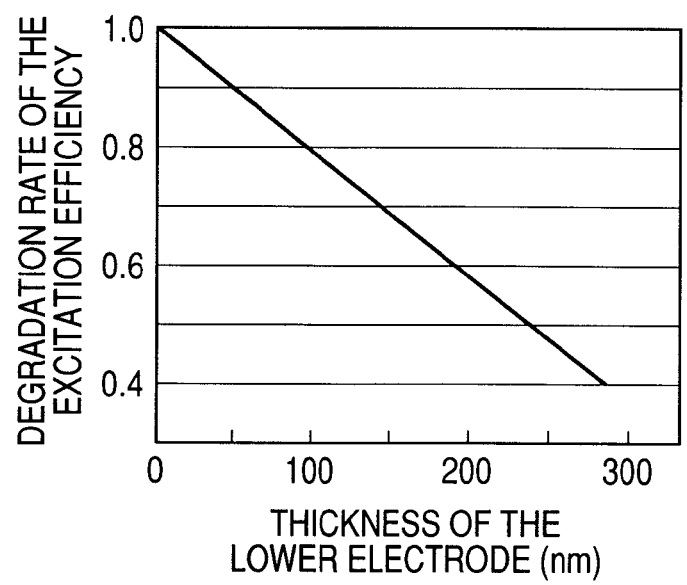
FIG. 6 shows an example of the relationship between thickness of a lower electrode and degradation of its excitation efficiency.

Next, FIG. 6 shows some points that must be taken into consideration for the structure of the resonator shown in FIGS. 1 through 3, respectively. In a case where the resonator 1 is formed to be compact and with a high frequency, the lower electrodes must be thinned. However, those electrodes cannot be thinned too much, in order to prevent the degradation of the Q value caused by an increase in electrical resistance. When the resonator is structured as shown in any of FIGS. 1 through 3, projections are generated on the surface of the piezoelectric thin film in accordance with the film thickness of the lower electrodes as shown in FIG. 5B. In the case of an inflection resonator, the vibrating part vibrates due to the expansion/contraction of the piezoelectric thin film in the in-plane direction. However, at each projection, the expansion/contraction in the in-plane direction does not cause any function according to the vibration. As a result, the vibration efficiency goes down in proportion to the film thickness of the lower electrodes.

FIG. 6 shows an example of the resonator in this state. The horizontal axis shows a thickness of the lower electrode and the vertical axis shows relative values of the degradation rate of the excitation efficiency. In the case of a real device, the film thickness is set around 100 nm to 300 nm to avoid a resistance increase caused by both surface oxidation and the outermost layer effect. Consequently, the excitation efficiency is reduced to half. The bandwidth, which is proportional to the excitation efficiency, is also reduced to half.

Next, variations of the vibration frequency that are caused by the piezoelectric material processing accuracy will be considered.

Figure 11:
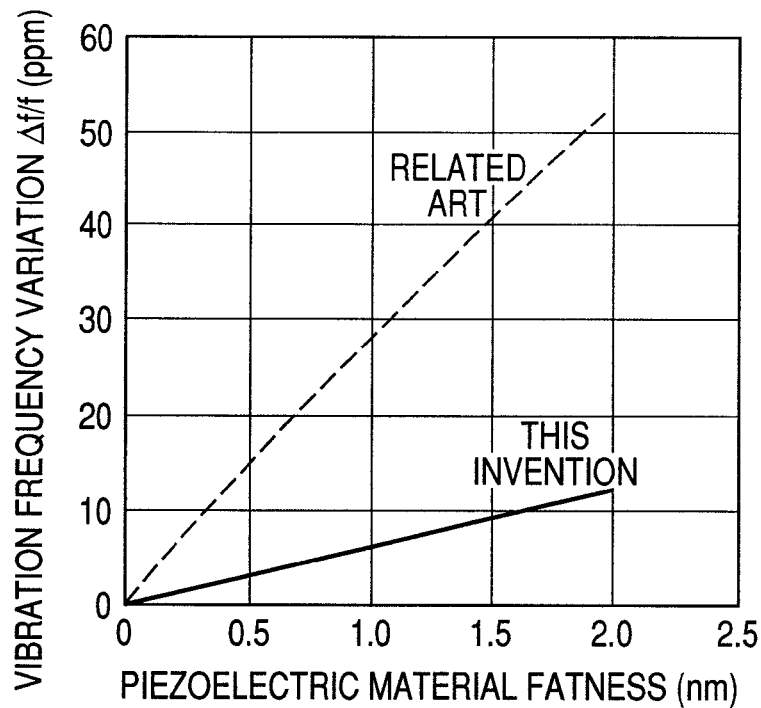
FIG. 11 shows an example of the relationship between the thickness of a piezoelectric material and the deviation of the vibration frequency of a resonator.

The processing accuracy in the 0.35 μm CMOS process, which is the main-current at present, is about 70 nm. FIG. 11 shows a relationship between thickness and deviation of the vibration frequency of the piezoelectric material. The characteristic shown with a dotted line denotes the characteristic of a conventional resonator, and the characteristic shown with a solid line denotes the characteristic of the resonator of the present invention. In the case of the conventional resonator, when the piezoelectric material extend the length of the frame by 1 nm, the oscillation frequency is shifted by 28 ppm. Because the processing accuracy is about 70 nm, the frequency varies by about 1960 ppm (=28 ppm/nm×70 nm) finally. In the composition of the resonator in the present invention, as shown in FIG. 11, the oscillation frequency variation to be caused by the process variation is suppressed to about 420 ppm (=6 ppm/nm×70 nm).

On the other hand, the oscillation frequency of an oscillator of a reference signal generator should be able to be changed more than the frequency variation caused by processes. In the case of a typical Colpitts type oscillator shown in FIG. 17 (to be shown later), the oscillation frequency f has a relationship as shown in the following expression with the static capacity Co of the resonator, the bandwidth Δ of the vibration, the serial resonant frequency fs of the resonator, the serially connected variable capacity Cv, and the complex number content Imag(Zosc) of the base impedance to be determined by both the capacity element 12 and the transistor.

$$\operatorname{Im}ag(Zosc) = \frac{1}{j^2 \pi f C v} + \frac{1}{j^2 \pi f C o \frac{f^2 - (1-\Delta)^2 fs^2}{f^2 - fs^2}} \quad \text{[Expression 1]}$$

As a concrete example, a microcomputer's reference frequency generator (reference frequency 14 MHz) is considered. A 14 MHz standard resonator is set to a static capacity Co=5.0 pF and Imag (Zosc)=128 ohms @ 14,000 MHz. In case where a typical variable capacity (e.g., Hitachi Seisakusho HVC375 (1/(2TTfCv)=612 to 996 ohms (1 to 2.5 V, @ 14,000 MHz)) is used, the bandwidth Δ must be set at Δ>0.6% to obtain the oscillation frequency variable width of 580 ppm or over (process variation 420 ppm and variable capacity variation 160 ppm). The above-described bandwidth reduction must be considered while taking those points into consideration.

Figure 7:
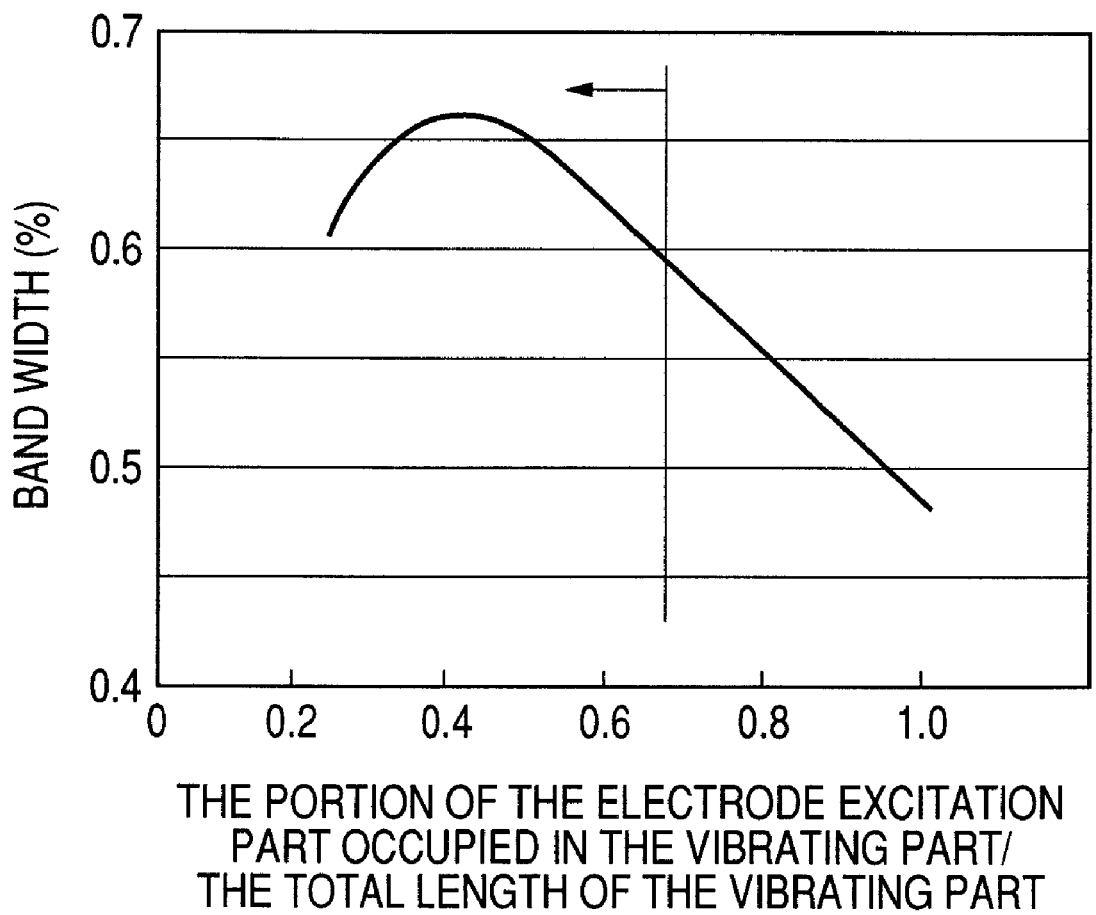
FIG. 7 shows an example of the relationship between the bandwidth and the ratio of (the portion of the electrode excitation part occupied in the vibrating part) to (the total length of the vibrating part)

FIG. 7 shows an example of the characteristic of the resonator in the first embodiment of the present invention as a more preferred embodiment. In FIG. 7, the vertical axis shows the bandwidth improvement rate (%) (on the basis of the oscillation frequency), and the horizontal axis shows the ratio of the excitation part occupied in the vibrating part as a length ratio. In this embodiment, this ratio is assumed to be ⅔ or under. Accordingly, two effects are obtained. In other words, as shown in FIG. 7, the bandwidth is improved by 0.6% or more, compared with the case where the vibrating part is patterned up to its tip with metal. This is because stress is not generated so much at the tip of the vibrating part. In addition, only a piezoelectric thin film is used around each tip of the vibrating part, which is the most sensitive to frequency variations. As a result, in the case of the resonator structured to make inflection vibration, the influence of the film thickness of the piezoelectric thin film, the film thickness of the metallic film, and the patterning variations to be exerted on the frequency are much reduced. Thus, the variation is reduced significantly.

Figure 8:
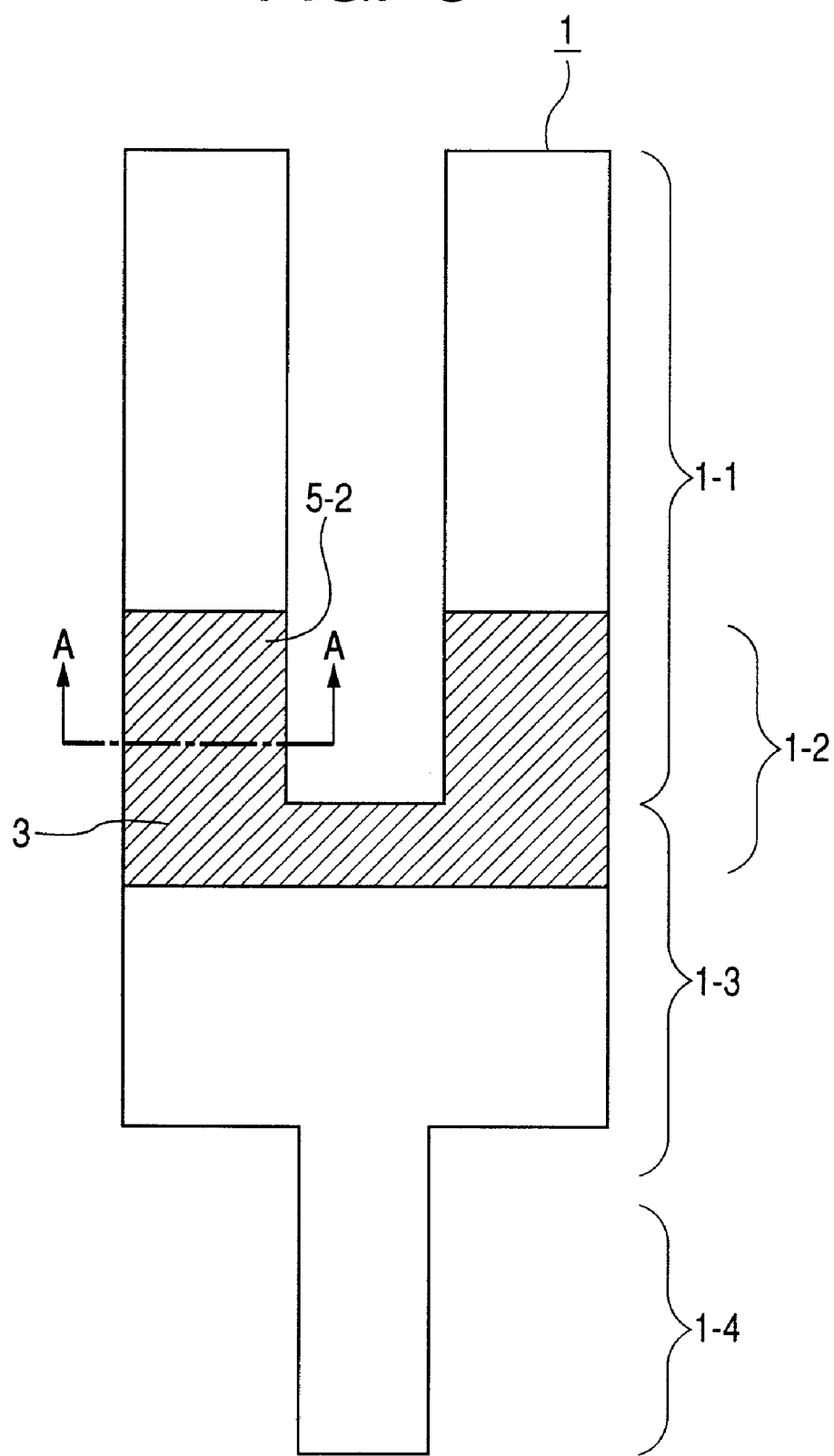
FIG. 8 is a top view of a resonator for describing another preferred embodiment of the present invention.
Figure 9:
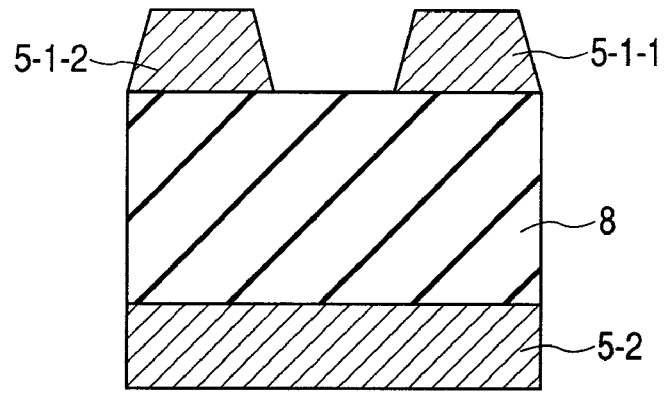
FIG. 9 is a cross-sectional view of the resonator taken along a line A-A shown in FIG. 8.

FIGS. 8 and 9 show still another preferred embodiment of the resonator described in the second embodiment of the present invention. FIG. 8 shows a top view of the resonator and FIG. 9 shows a cross-sectional view of the resonator taken along a line A-A. In FIGS. 8 and 9, the same numerals are used for the same parts of those shown in FIGS. 2 and 5. Reference numeral 5-2 denotes a lower electrode. In this embodiment, the lower electrode 5-2 of the resonator is not connected to any of the upper electrodes 5-1. The lower electrode 5-2 shown in FIGS. 8 and 9 is formed as a floating electrode, or an electrode connected to the ground.

On the other hand, in the case of the resonator shown in each of FIGS. 2 and 3, 5-1-1 and 5-2-1 are connected to the port 4-1 and 5-1-2 and 5-2-2 are connected to the port 4-2. In the first embodiment of the present invention, however, 5-1-1 is connected to the port 4-1 and 5-1-2 is connected to the port 4-2. The floating electrode 5-2 is given a potential between 5-1-1 and 5-1-2. Although only a single electrode is used as the lower electrode in the first embodiment of the present invention, therefore, the electric field can be set in the same direction as that of the conventional resonator shown in FIGS. 2 and 3.

The upper electrode 5-1, as shown in FIG. 9 (sectional view), can be formed as a rectangular piezoelectric thin film in a low-cost process so as to prevent the excitation efficiency from degradation as shown in FIG. 6. In addition, the floating electrode 5-2, which functions electrically as a mirror surface, becomes equal to a pseudo setting in which a piezoelectric thin film exists above the floating electrode and an electrode image exists under the floating electrode. Consequently, the electrical symmetry in the vertical direction is assumed, thereby preventing effectively the bandwidth from reduction. For the same reason, the floating electrode can also prevent the destruction of the vertical electrical symmetry to be caused by the tapered side surfaces of the piezoelectric thin film.

Figure 10:
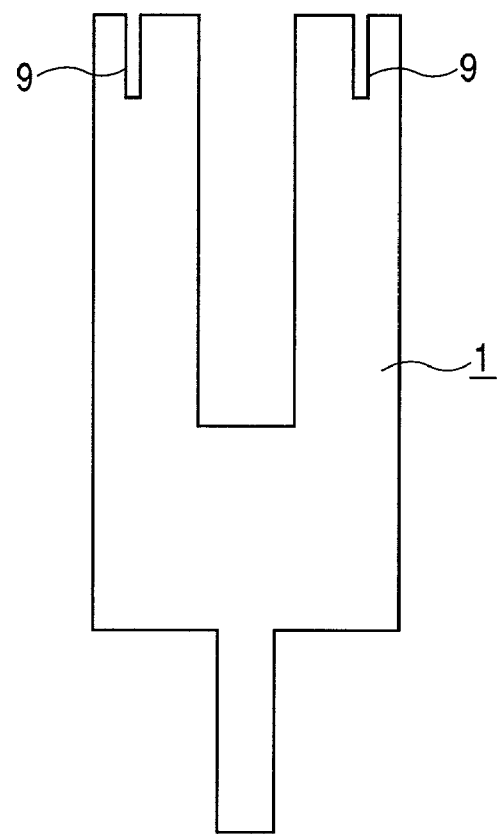
FIG. 10 is a top view of a resonator for describing another preferred embodiment of the present invention.

FIG. 10 shows still another preferred embodiment of the resonator described above. In this embodiment, a recess 9 is formed at the side surface of each tip of the vibrating part to extend the length of the frame (side surface) of the tip of the vibrating part. In this embodiment, an aluminum nitride sputtering film is used as the piezoelectric thin film, and the film is patterned by a dry-etching technique that uses a chlorine gas ($BCl_3$). FIG. 11 shows a relationship between the depth of etching for the side surface of the nitride aluminum calculated in terms of the etching time and the vibration frequency of the resonator. The depth of the recess 9 is 15 μm. In this embodiment, it is possible to reduce the variation of the resonator's vibration frequency to be caused by etching variations in the patterning process of the aluminum nitride to about ⅕.

Figure 12:
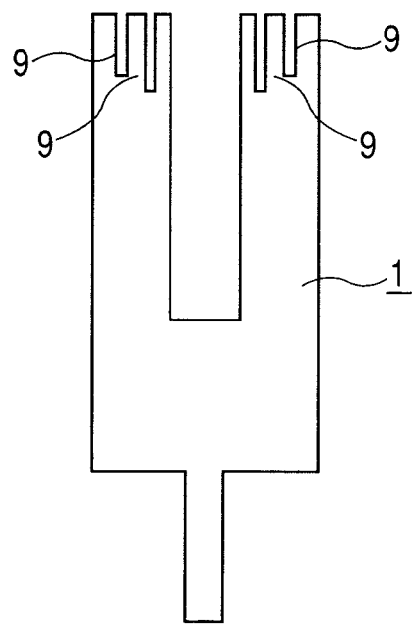
FIG. 12 is a top view of a resonator in another preferred embodiment of the present invention.
Figure 13:
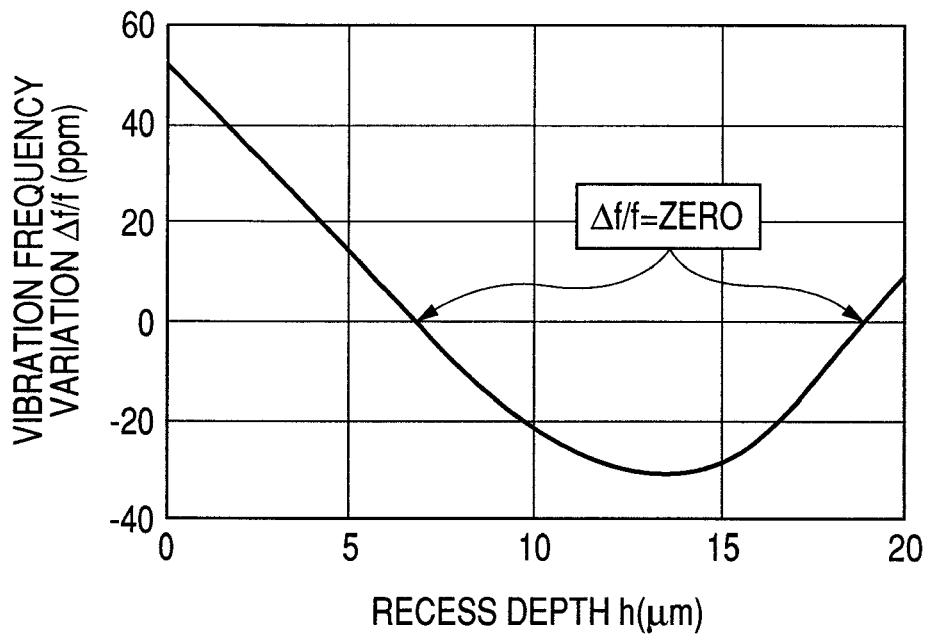
FIG. 13 shows an example of the relationship between the depth of the recess and the deviation of the vibration frequency of a resonator.

FIG. 12 shows the resonator in a variation of the embodiment of the present invention shown in FIG. 10. In this embodiment, the vibrating part has a plurality of recesses 9 formed at the side surface of each tip of the resonator to extend the length of the frame (side surface) of the tip of the resonator. FIG. 13 shows the dependency of the rate of change of the vibration frequency of the resonator on the depth of the recess. The horizontal axis shows the depth h of the recess, and this value is calculated from the depth of etching for the side surface of the aluminum nitride converted from the etching time. The vertical axis shows relative values of the deviation of the vibration frequency. As shown in FIG. 13, the vibration frequency can be kept stably by adjusting the depth of the recess.

According to this aspect of the present invention, it is possible to almost eliminate the variation of the vibration frequency of the resonator caused by the etching variation, as well as to improve the yield in the mass production process and omit the laser trimming process, whereby the manufacturing cost is reduced significantly.

The vibration frequency of the tuning-fork type inflection resonator is determined by the strength of stability of the vibrating part at the time of its inflection, which depends on the width of the vibrating part, as well as on the inertia moment of the vibrating part. The inertia moment with respect to etching is improved by providing such recesses 9 at the tips of the vibrating parts. According to the present invention, the change of the restoring force in etching and the change of the inertia mass in etching negate each other, thereby almost eliminating the variation of the vibration frequency.

Figure 14:
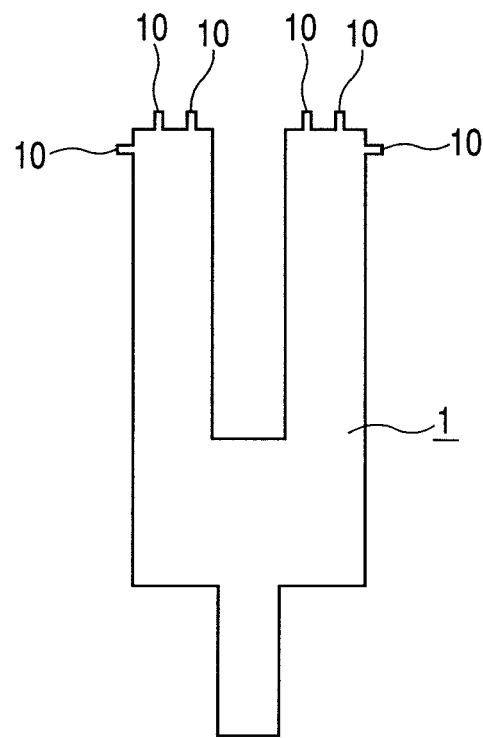
FIG. 14 is a top view of a resonator in a preferred embodiment of the present invention.
Figure 15:
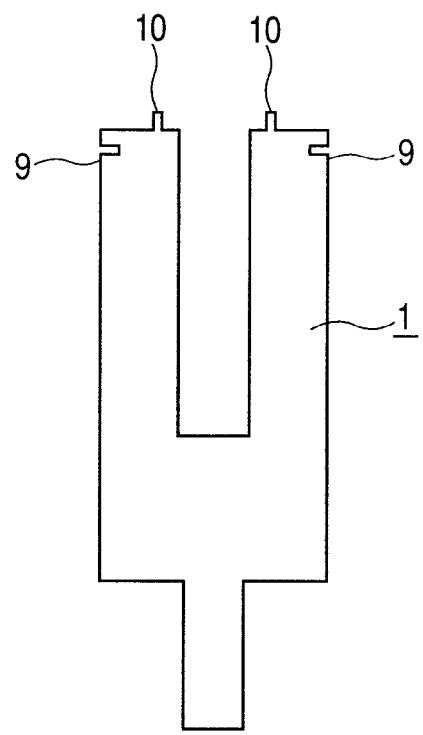
FIG. 15 is a top view of a resonator in a preferred embodiment of the present invention.
Figure 16:
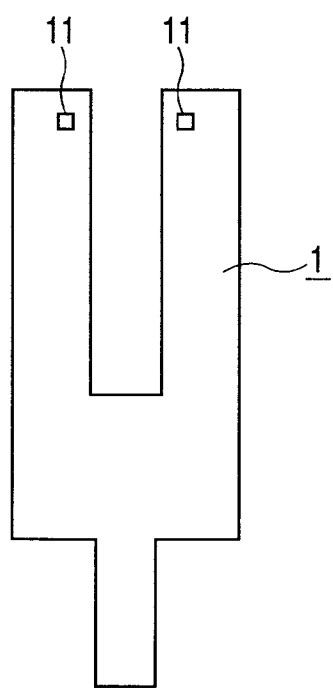
FIG. 16 is a top view of a resonator in a preferred embodiment of the present invention.

In FIG. 12, although the recesses 9 are formed at the tips of the resonator, the same effect can be obtained by extending the length of the frame (side surface) of the vibrating part. FIGS. 14 through 16 show examples of various types of such changes. In FIG. 14, the resonator is provided with projections 10 around its tip portions. FIG. 15 shows the resonator provided with a projection 10 and a recess 9 around its respective tip portions. FIG. 16 shows the resonator provided with a hole 11 around each of its tip portions. The resonator may also be provided with such recesses, etc. off its tips. However, note that the inertia moment changes more significantly when the recesses are provided near its tips, the process can be controlled more easily, and spurious resonance occurrence can be suppressed more easily when the resonator is provided with such recesses.

Figure 17:
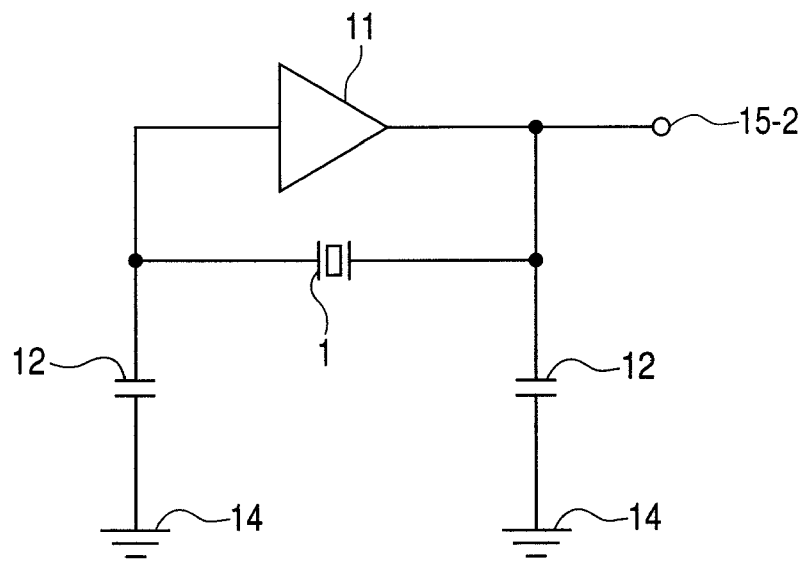
FIG. 17 is a circuit diagram of an equivalent circuit for which the resonator of the present invention is applied.
Figure 18:
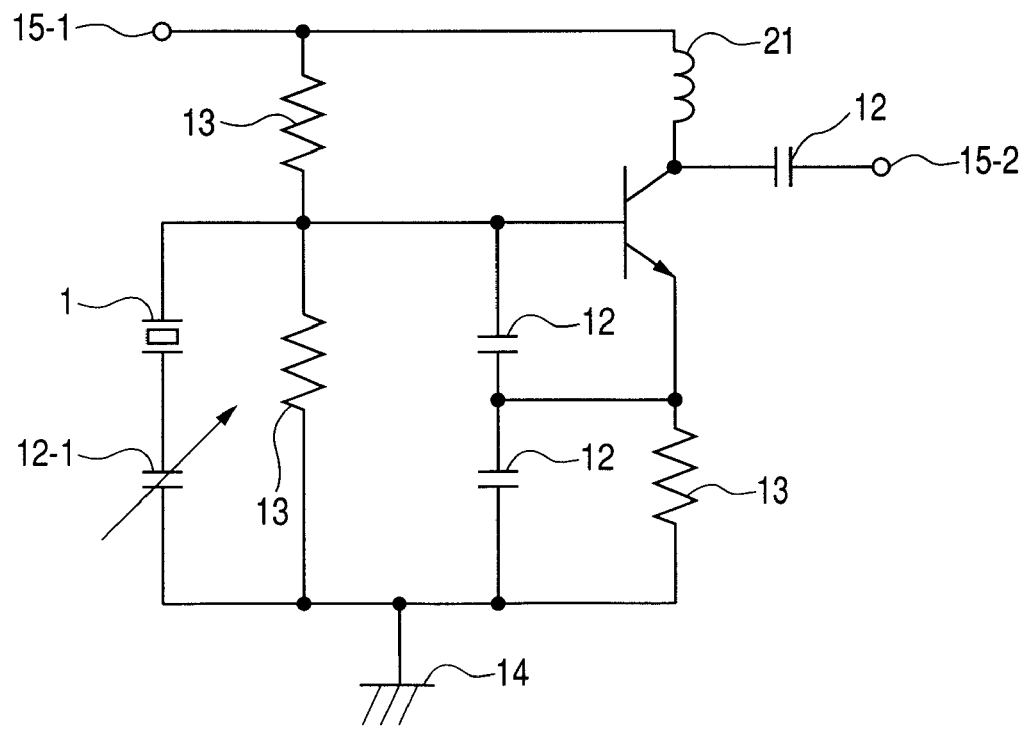
FIG. 18 is another circuit diagram of an equivalent circuit for which the resonator of the present invention is applied.
Figure 19:
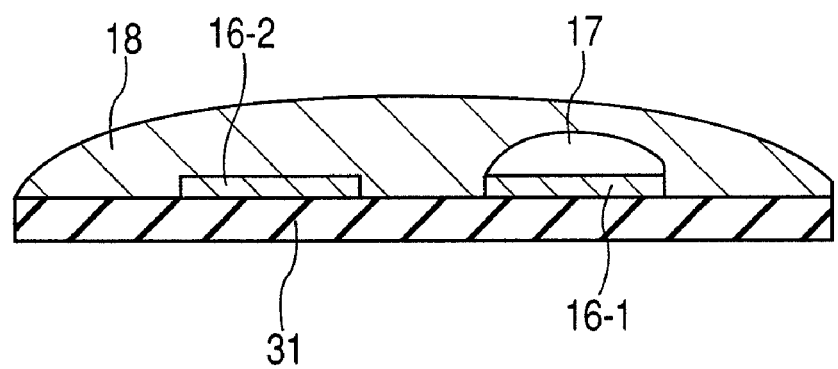
FIG. 19 is a cross-sectional view of a resonator of the present invention, which is mounted in a device.

FIGS. 17 and 18 show a preferred example of a thin film tuning-fork type inflection resonator shown in further embodiments of the present invention. FIG. 19 shows a cross-sectional view of a module usable commonly in these embodiments.

For example, an oscillation circuit comprises a passive part having functions of a thin film tuning-fork type inflection resonator 1, a capacitor 12, a resistor 13, and an inductor 21, as well as an active part. Reference numeral 14 denotes grounding. The passive parts except for the resonator 1 and the active part are integrated into an LSI chip 16-2, for example, as shown in FIG. 19.

In addition to the oscillation circuit shown in FIGS. 17 and 18 respectively, the LSI chip 16-2 includes a signal processing function. The thin film tuning-fork type inflection resonator 1 is structured to have a hollow portion 17 in the vibrating part. The LSI chip 16-2 and the resonator chip 16-1 are connected physically to each other through a pedestal part 31. In addition, the LSI chip 16-2 and the resonator chip 16-1 are connected electrically to each other as shown in the equalization circuit in FIG. 17 or 18. Reference numerals 15-1 and 15-2 denote a power supply terminal and an output terminal respectively.

In this example, the resonator 1 is formed on a silicon chip, so that the resonator 1 can be mounted together with an LSI chip on one base, whereby the module can be reduced in size. Furthermore, the electric lead line between each transistor and the resonator can be shortened, permitting elimination of unnecessary parasite components. As well, the noise caused by the electric-lead-line loss can be reduced.

Figure 20:
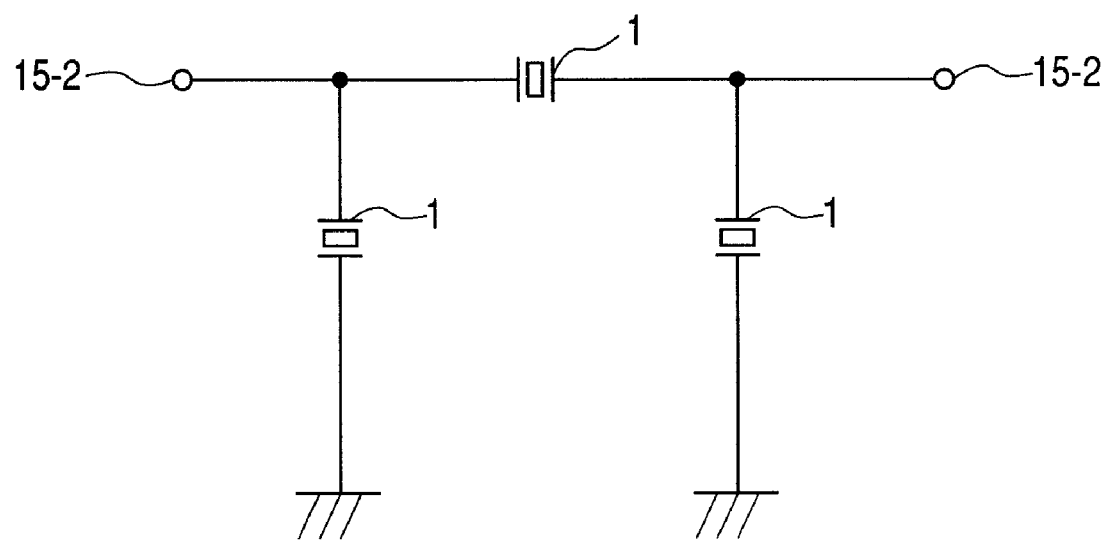
FIG. 20 is another example of a circuit diagram of an equivalent circuit in which a resonator of the present invention is applied.

FIG. 20 shows an example of an equivalent circuit such as a band-pass type frequency filter as another embodiment of the present invention. In this embodiment, because a thin film tuning-fork type inflection resonator 1 is connected to a series arm and a shunt arm respectively, a band-pass type frequency filter can be realized.

Reference 15-2 denotes an output terminal. Each thin film resonator is formed on the same silicon substrate. The electric-lead-line resistor between the resonators causes filter loss/degradation. According to this example, because resonators are formed on one silicon substrate, the distance between the resonators can be shortened, so that a filter with low loss can be realized. In addition, because resonators with small variations of the vibration frequency are used, the synergistic degradation of the conforming article ratio caused by integration of plural resonators can be reduced significantly.

Figure 21:
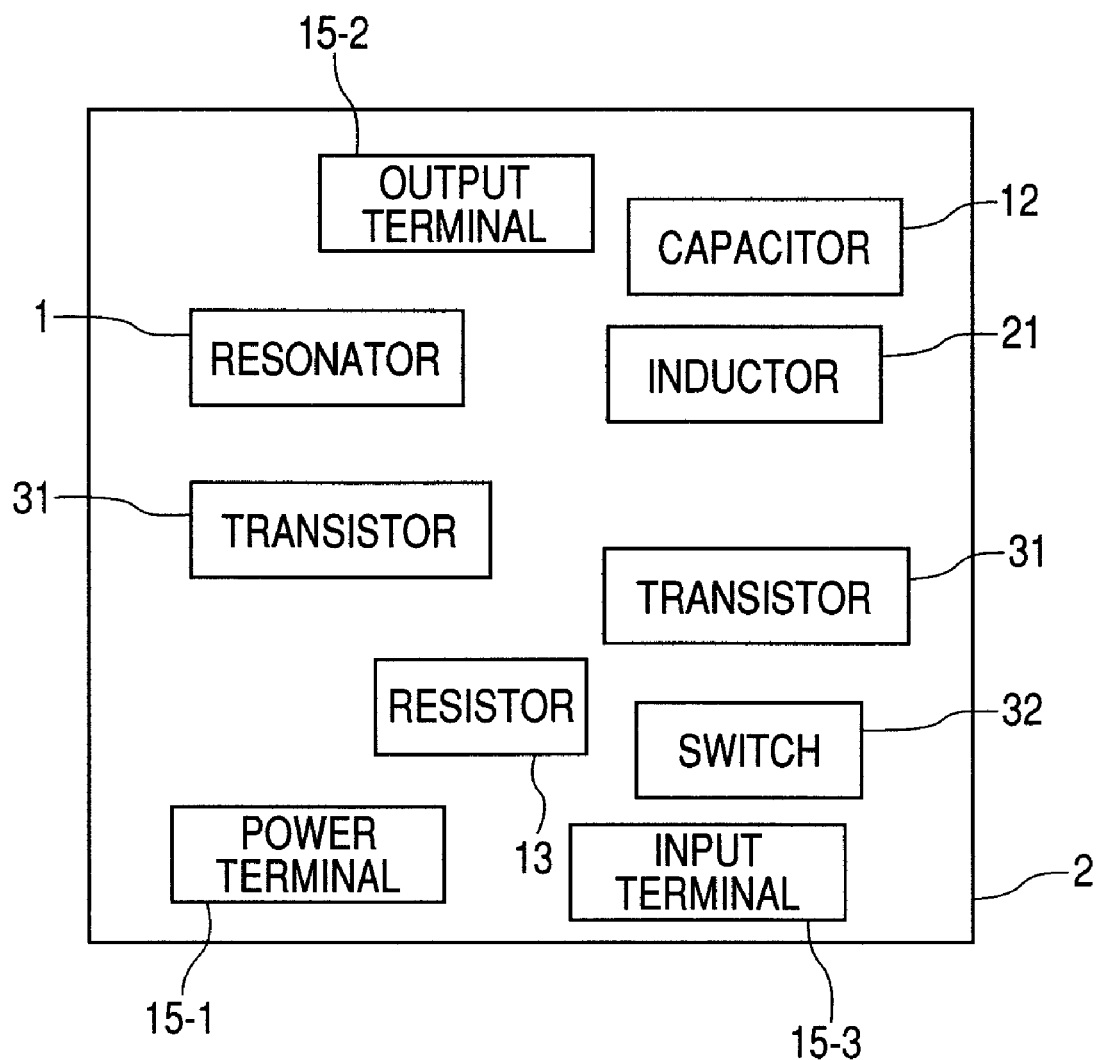
FIG. 21 is a top view of the arrangement of a resonator of the present invention and other electric parts to be integrated on a substrate.

FIG. 21 shows a top view of an example of disposing the resonators of the present invention and other electronic parts on a substrate in an integrating process. The electrical parts to be integrated on the silicon substrate 2 together with the resonator 1 include two transistors 31, an inductor 21, a capacitor 12, a resistor 13, a switch 32 such as an FET, and other various types of terminals. These electrical parts are connected to each another by electric lead line such as a metallic film. The silicon chip, after being subjected to a passivation process, is mounted directly on another circuit substrate through an interposer. According to this example, because a resonator and other electrical parts are formed on the same silicon chip, the resonator having been required conventionally for external connection may be omitted, thereby reducing the size of the subject. In addition, because electric lead line between each transistor and the resonator can be shortened, unnecessary parasite components can be omitted, and the noise caused by electric lead line loss can be reduced. Furthermore, because a resonator with fewer vibration frequency variations is used, the synergistic degradation of the conforming article ratio caused by integration of the resonator and other electric parts can be reduced significantly.

As described above in detail, according to the present invention, it is possible to provide a low cost resonator enabling the subject system to be reduced in size, a higher specific vibration frequency and a higher Q value to be set, the bandwidth to be widened, the variation of the electrical characteristic with respect to the process variation to be minimized, and laser trimming to be omitted. In other words, according to the present invention, because the resonator has electrodes at places where stress is concentrated and is structured with a single material at places where the amplitude is large, the resonator enables both the elastic spring coefficient and the dependency of the inertia mass on the film thickness to be negated. According to the present invention, therefore, it is possible to provide an LSI in which compact resonators are integrated at a low price.

In addition, because notches are formed around the tips of each vibrating part, or recesses/projections are provided at each side surface of the resonator, both the elastic spring coefficient and the dependency of the inertia mass on an etching/taper level are negated respectively. Consequently, according to one aspect of the present invention, it is possible to provide an LSI in which high precision resonators are integrated at a low price.

Furthermore, because the present invention can stably manufacture compact thin film resonators for which etching depth cannot be controlled easily, the manufacturing deviation can be suppressed, whereby it is possible to provide a lower price LSI in which high frequency thin film resonators are integrated.

What is claimed is:

1. A thin film tuning-fork type inflection resonator, comprising:
    a substrate;
    a piezoelectric thin film formed into a tuning-fork shape, said piezoelectric film having a supporting part at which the piezoelectric thin film is fixed to the substrate, and further having a vibrating part which is fixed to the substrate only through said supporting part, and which is formed a predetermined distance over the substrate;
    a first metallic electrode formed on a first surface of said piezoelectric thin film; and
    a second metallic electrode formed on a second surface of said piezoelectric thin film opposite said first surface of said piezoelectric thin film,
    wherein said piezoelectric thin film is made of an aluminum nitride or zinc oxide film;
    wherein said first metallic electrode is deposited as a film on said first surface of said piezoelectric thin film;
    wherein said piezoelectric thin film is formed so as to cover said second metallic electrode; and
    wherein a first area of said vibrating part of said piezoelectric thin film is a non-laminate single film of said piezoelectric film; and a second area of said vibrating part of said piezoelectric thin film is laminated with said first metallic electrode and said second metallic electrode.

2. The thin film tuning-fork type inflection resonator according to claim 1,
    wherein said tuning-fork-shaped piezoelectric thin film further includes a plurality of said vibrating part,
    wherein said first and second metallic electrodes are formed at least on part of said supporting part and on part of each of said plurality of vibrating parts, and said first and second metallic electrodes formed on each of said plurality of vibrating parts are positioned on each of said plurality of vibrating parts within the distance of ⅔ from a root thereof to a tip thereof.

3. The thin film tuning-fork type inflection resonator according to claim 2,
    wherein said first metallic electrode includes a plurality of electrodes and said second metallic electrode consists of a single electrode.

4. The thin film tuning-fork type inflection resonator according to claim 2,
    wherein at least one of said plurality of vibrating parts has at least one of a recess at a side surface thereof, a projection at said side surface, or a hole passing through a portion between said first surface and said second surface.

5. The thin film tuning-fork type inflection resonator according to claim 4,
    wherein each of said plurality of vibrating parts has at least two of said recess, said projection, and said hole.

6. A thin film tuning-fork type inflection resonator comprising:
    a substrate;
    a piezoelectric thin film formed into a tuning-fork shape, the piezoelectric film having a supporting part, a pedestal part, and a vibrating part, the piezoelectric thin film being fixed to the substrate at the supporting part, the pedestal part being physically connected to the supporting part and to the vibrating part between the supporting part and the vibrating part, the pedestal part being fixed to the substrate only through the supporting part, the vibrating part being fixed to the substrate only through the supporting part and the pedestal part, and the pedestal part and the vibrating part being formed a predetermined distance over the substrate;
    a first electrode formed on a first surface of the piezoelectric thin film; and
    a second electrode formed on a second surface of the piezoelectric thin film opposite the first surface of the piezoelectric thin film,
    wherein said piezoelectric thin film is made of an aluminum nitride or zinc oxide film;
    wherein said first and second electrodes are formed on root portions of said vibrating part, and there are no first and second electrodes at tip portions of said vibrating part, and wherein the vibrating part has a length defined as the distance from a tip thereof to the pedestal part, and wherein the tip portions are defined as that portion of the vibrating part that is ⅓ of said length as measured from the tip of the vibrating part.

7. A thin film tuning-fork type inflection resonator according to claim 6,
wherein said first and second electrodes are formed on portions of said vibrating part within a distance of ⅔ from a root of said vibrating part.

8. A thin film tuning-fork inflection resonator according to claim 6,
wherein at least one of a recess, a projection, and a hole passing through the first and second surfaces of the piezoelectric thin film, is formed on the vibrating part where there are not formed said first and second electrodes.

* * * * *